United States Patent
Correll

(10) Patent No.: US 9,414,535 B1
(45) Date of Patent: Aug. 9, 2016

(54) PASSIVE RFID DATA SIGNAL DISTORTION DEVICE

(71) Applicant: Kevin P Correll, North Kingstown, RI (US)

(72) Inventor: Kevin P Correll, North Kingstown, RI (US)

(*) Notice: Subject to any disclaimer, the term of this patent is extended or adjusted under 35 U.S.C. 154(b) by 382 days.

(21) Appl. No.: 13/747,085

(22) Filed: Jan. 22, 2013

Related U.S. Application Data

(60) Provisional application No. 61/589,382, filed on Jan. 22, 2012.

(51) Int. Cl.
*G06K 19/06* (2006.01)
*H05K 1/03* (2006.01)
*H05K 9/00* (2006.01)

(52) U.S. Cl.
CPC .................................. *H05K 9/0075* (2013.01)

(58) Field of Classification Search
CPC ......... H05K 1/0275; H05K 1/09; H05K 9/00; H05K 9/0075
USPC .......................................... 235/492; 174/256
See application file for complete search history.

(56) References Cited

U.S. PATENT DOCUMENTS

| | | | | |
|---|---|---|---|---|
| 4,641,017 A * | 2/1987 | Lopata | .................... | G07F 7/125 235/454 |
| 4,859,550 A * | 8/1989 | Gruber | ............... | G03G 9/08782 430/108.1 |
| 5,494,735 A * | 2/1996 | Nitta | ........................ | B32B 27/12 428/207 |
| 6,177,176 B1 * | 1/2001 | Tanabe | ............. | G06K 19/06046 369/283 |
| 6,616,190 B1 * | 9/2003 | Jotcham | .................... | D21H 1/48 283/109 |
| 6,916,047 B2 * | 7/2005 | Jarvis | ........................ | B32B 7/12 283/102 |
| 2010/0102966 A1* | 4/2010 | Skowronek | .......... | G06K 19/005 340/572.8 |
| 2011/0024181 A1* | 2/2011 | Phillips | .................. | B65D 27/02 174/350 |

* cited by examiner

*Primary Examiner* — Sherman Ng
(74) *Attorney, Agent, or Firm* — K.P. Correll & Associates, LLC

(57) ABSTRACT

The present invention comprises a RFID signal distortion device which overcome the foregoing difficulties which have long since characterized the prior art. In accordance with the broader aspects of the invention the RFID device comprises multiple layers of substrates; wherein each substrate is adapted, when the RFID device is positioned substantially orthogonal to the transmitting plane of the RFID device, to distort data transmission from an RFID when the RFID is interrogated by an electric field or a magnetic field.

8 Claims, 3 Drawing Sheets

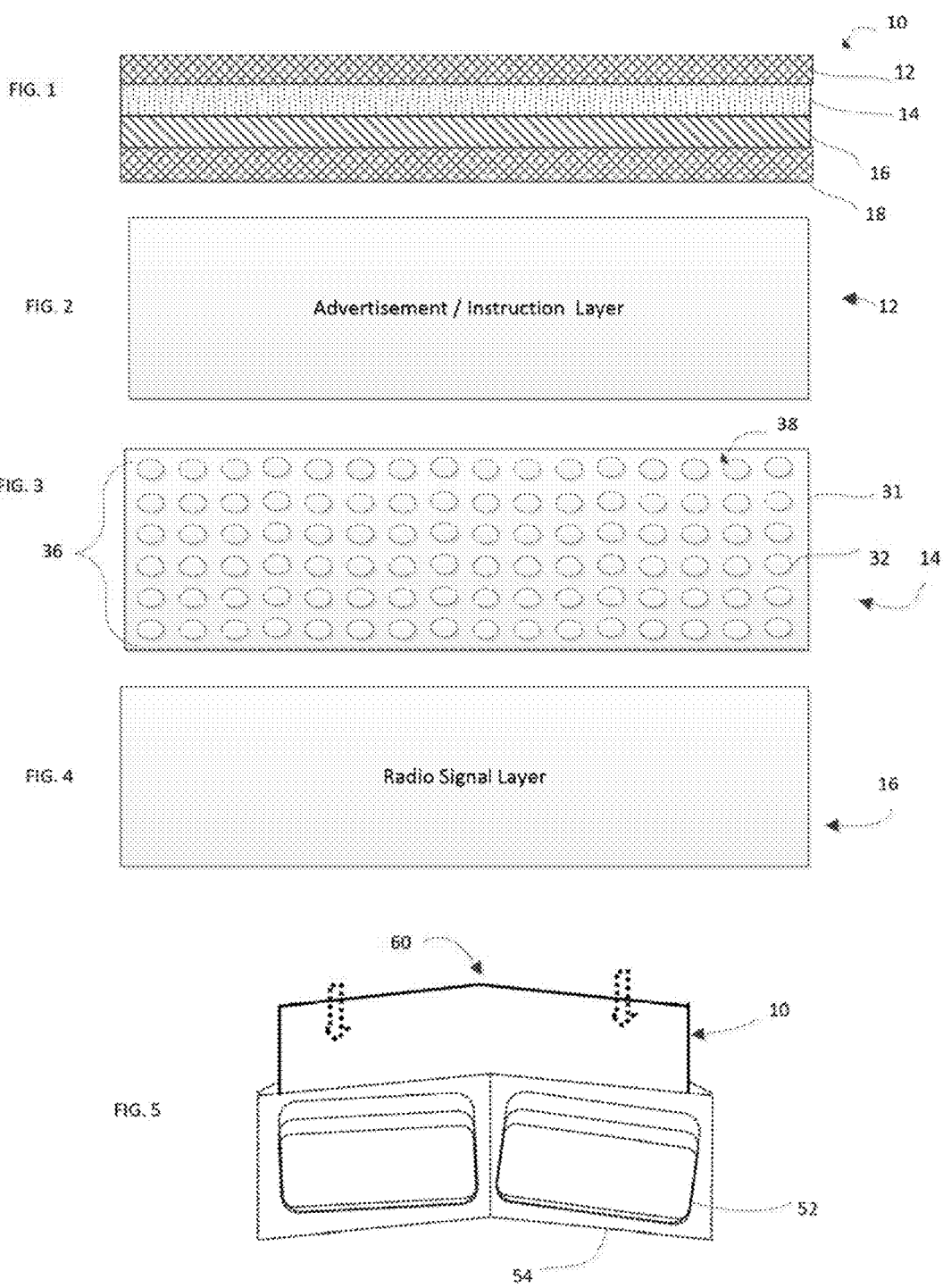

PASSIVE RFID DATA SIGNAL DISTORTION DEVICE

CROSS-REFERENCE TO RELATED APPLICATIONS

The present application is related to, claims the earliest available effective filing date(s) from (e.g., claims earliest available priority dates for other than provisional patent applications; claims benefits under 35 USC §119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith. U.S. provisional patent application 61/589,382 entitled "Passive RFID Data Signal Distortion Device", naming Kevin Correll, as inventor, filed 22 Jan. 2012.

BACKGROUND

1. Field of Use

This invention relates generally to intentional distortion of Radio Frequency Identification (RFID) devices, and more particularly to devices for preventing unauthorized electronic retrieval of personal information from identification cards, credit cards, and other RFID equipped cards.

2. Description of Prior Art (Background)

Radio Frequency Identification technologies, commonly referred to as RFID, utilize electronic signals to identify people and objects. In general, a RFID system comprises at least one microchip and an antenna, together referred to as an RFID transponder or tag, and at least one reader. The antenna enables the chip to electronically transmit identification data to the reader. The reader receives and converts the radio waves into digital information for further processing.

RFID systems are used in numerous industries, the most common being use of RFID systems for asset tracking purposes. Active RFID tags have their own transmitter and power source and are therefore used for tracking larger objects across greater distances. Passive RFID tags do not have either a power source or an antenna. Instead they simply reflect radio waves back to a reader associated with the transmission a of an electronic signal. Passive tags are therefore more limited in range. Examples of passive tag systems include tollbooth applications enabling a transponder on a vehicle to reflect a signal to a reader in the tollbooth and inventory tracking systems in retail stores that track inventory movement within the store and prevent theft of items from the store.

More recently RFID systems have been implemented into touchless express pay systems whereby payment can be made by simply waving a credit card or key fob in front of a reader. Although highly convenient, express pay systems incorporate the inherent danger that the associated account will be charged by accident or possibly charged without the owner's knowledge. Indeed, theft of credit or debit card information and identification has become rampant worldwide. Governments, companies, and consumers spend millions of dollars each year to prevent and pursue such thefts.

Nevertheless, recent developments in security technology still do not fully address potential security breaches of an RFID system; such as when an unauthorized RFID interrogation or reading device attempts to extract the RFID information, especially when a user or possessor of an RFID device is unsuspecting or not cognizant that the RFID device is being interrogated. Others have attempted solutions at blocking RFID devices to enhance privacy.

Prior art solutions typically involve a shielded wallet or bill-fold comprising a textile material having electromagnetic shielding incorporated therein. In other words, prior art solutions attempt to shield or block electromagnetic signals from reaching the RFID device. This approach often leads to bulky shielding solutions, such as, for example, cases made of aluminum. In addition, while aluminum is often used as electromagnetic shielding of an electric field it can fail to block a magnetic field. Other prior art solutions disclose lengths of electromagnetic shielding for electric fields but also fail to disclose layers of electromagnetic shielding wherein each layer of the electromagnetic field is adapted to block different types of electromagnetic fields due to different types of RFID data transfer, e.g., electric fields associated with RFID backscatter techniques and magnetic fields associated with RFID magnetic dipole antennas. In addition, prior art textile or fabric type shields are generally designed to block electromagnetic frequencies in the high megahertz (MHz) to gigahertz (GHz) range. However, mainstream RFID frequency ranges are on the order of below 150 kilohertz (KHz) for magnetic inductive coupling to about 15 MHz for inductive coupling and backscatter techniques.

Still other complex prior art solutions disclose an RFID card designed to radiate an interference pattern sufficient to disrupt or interfere with the data transmission of the RFID being interrogated. These solutions, aside from being expensive, require that the interfering RFID card radiate a pattern of sufficient strength and signal similarity with the interrogated RFID card in order to disrupt or interfere with the signal radiated by the interrogated RFID card. However, these types of solutions are comparatively expensive and require complex micro-circuitry. Moreover, each RFID card, or groups of RFID cards, requiring protection may need a separate interfering RFID matched to its specific type of data transmission. For example, a RFID card using electromagnetic backscatter techniques would need interfering RFID using similar techniques. Likewise, a RFID card using magnetic dipole antenna would require in interfering RFID card using similar magnetic dipole antenna techniques. It will be appreciated that this approach would be very cumbersome for the user to carry extra interfering RFID cards, in addition to the ones the user typically carries. It will also be appreciated that the user would likely be confused which interfering RFID card goes with which RFID card to be protected; particularly since the data communication type of RFID card, e.g., magnetic dipole or electromagnetic backscatter, is not readily apparent.

Shielding against low-frequency magnetic fields is, comparatively, not as easy as shielding against electric fields. The effectiveness of magnetic shielding depends on the type of material—its permeability, its thickness, and the frequencies involved. Due to its high relative permeability, steel is much more effective than aluminum and copper as a shield for low-frequency (roughly below 100 kHz) magnetic fields. At higher frequencies, however, aluminum and copper can be used as well. However, the magnetic shielding properties of these metals are quite ineffective at low frequencies. In general, the magnetic shielding provided by non-magnetic conductor depends upon random eddy currents induced in the non-magnetic conductor by the magnetic reader field and the subsequent random counter magnetic fields opposing the magnetic reader field. Better magnetic shields such as Mu-metal can be found for low-frequency magnetic shielding; but, Mu-metal is very fragile, relies on thickness or depth for its magnetic shielding; and can have severe degradation of its permeability, and hence, degradation of its effectiveness as a magnetic shield by mechanical shocks. Consequently, to be effective, Mu-metal solutions require bulky, difficult to handle, Mu-metal shielding.

BRIEF SUMMARY

The present invention comprises a RFID signal distortion device which overcome the foregoing difficulties which have long since characterized the prior art. In accordance with the broader aspects of the invention the RFID device comprises multiple layers of substrates; wherein each substrate is adapted, when the RFID device is positioned substantially orthogonal to the transmitting plane of the RFID device, to distort data transmission from an RFID when the RFID is interrogated by an electric field or a magnetic field.

According to this invention, a passive RFID data signal distortion device is provided. The device includes a first substrate having a top surface area adaptable to receive print media. The device also includes a bottom surface area having a plurality of magnetically receptive deposits for disruption of data transferred via magnetic induction. The device also includes a second substrate having an electric field disruption material; and an adhesive layer for bonding the bottom surface area of the first substrate to the second substrate.

The invention is also directed towards a passive RFID data signal distortion device. The device includes a first substrate having a top surface area adaptable to receive magnetically receptive ink printed as a message, artwork, or advertisement. The device also includes a second substrate comprising an electric field disruption material. The second substrate and the first substrate are bonded together by an adhesive layer. Optionally, the adhesive layer may contain metallic particles for disrupting either the electric field or magnetic field data transfer.

The invention is also directed towards a passive RFID data signal distortion device. The device includes a first substrate having a top surface area adaptable to receive print media. The print media includes a plurality of printed magnetically receptive deposits, wherein each of the printed magnetically receptive deposits comprises a layer thickness less than 20 microns thick. The spatial location of each of the plurality of printed magnetically receptive deposits is predetermined. Each of the plurality of printed magnetically receptive deposits includes magnetites; resin binders; and plastizers combined to form a laser printing toner composition. The device also includes a second substrate for disrupting or blocking electric fields or radio frequency transmissions. In addition, the spatial location of each of the plurality of printed magnetically receptive deposits may be predetermined according to an opposing magnetic field generated by the second substrate in response to an exterior magnetic field. In addition, the spatial location of each of the plurality of printed magnetically receptive deposits may also be predetermined according to a predetermined image.

BRIEF DESCRIPTION OF THE DRAWINGS

FIG. 1 is a side perspective view of the portable RFID signal distortion device according to this invention;

FIG. 2 is a pictorial top view of the advertising/instruction layer of the invention shown in FIG. 1;

FIG. 3 is a pictorial top view of the magnetic field interference layer of the invention shown in FIG. 1;

FIG. 4 is a pictorial top view of the electric field interference layer of the invention shown in FIG. 1;

FIG. 5 is a pictorial view of a billfold employing the invention shown in FIG. 1 and FIG. 6;

DETAILED DESCRIPTION

Figure 6:
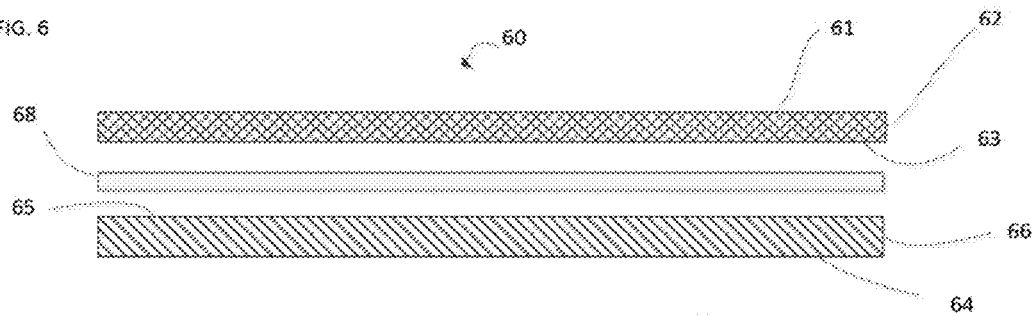
FIG. 6 is a side perspective view of an alternate embodiment of the portable RFID signal distortion device shown in FIG. 1.

Referring to FIG. 1 there is shown a side perspective view of the portable RFID signal distortion device 10 according to this invention. FIG. 1 illustrates an embodiment of the invention comprising layers of electric field distortion layer 16, magnetic field distortion layer 14, and print layer 10. Optionally print layer 18 may also be included.

Referring still to FIG. 1, and also FIG. 2, the RFID blocking device 10 also comprises a media layer 12. The media layer 12 may be any suitable media layer such as a flexible printable layer for conveying, for example, advertising instructions, warnings, or public service messages. The media layer 12 may also be a photographic layer comprising suitable photographic paper.

Referring also to FIG. 1 and FIG. 4, the RFID blocking device 10 comprises electric field signal distortion layer 16. The electric field distortion layer 16 may be any suitable electric field distortion layer having electric field distortion properties combined with flexible properties; such as, for example, aluminum foil. It will be appreciated that any suitable electric field distortion layer may be used, such as, for example: metalized fabrics, carbon impregnated polyethylene; mirrored plastics, metallic coated mesh; and conductive polyethylene and other plastics.

Referring also to FIG. 1 and FIG. 3, the RFID blocking device 10 also includes a magnetically receptive layer 14 combined with flexible properties. Magnetically receptive layer 14 includes suitable substrate 31. Substrate 31 may be any suitable substrate such as, for example, paper, foil, or fabric. Substrate 31 may be a separate substrate or alternatively may be one or both sides of media layer 12 and/or one or both sides of electric field signal distortion layer 16.

Still referring to FIG. 1 and FIG. 3, magnetically receptive layer 14 includes magnetically receptive signal distortion grating 36. Magnetically receptive signal distortion grating 36 comprises magnetically receptive deposits 32 arranged to interfere with data transmission for impinging magnetic and electric fields generated by an RFID reader or by an RFID card activated by an RFID Reader. The magnetically receptive deposits 32 may be any suitable magnetically receptive deposit shape or character painted, printed, or otherwise deposited on magnetically receptive layer 14. In addition, magnetically receptive signal distortion grating 36 also comprises spaces 38 between magnetically receptive deposits 32. Spaces 38 may be any suitable size space between magnetically receptive deposits 32 selected to optimize interference. Magnetically receptive deposits 32 are preferably less than 25 microns thick.

The magnetically receptive layer 14 is generally imprinted upon substrate 31 and is generally on the order of a few microns in depth, however, any suitable receptive layer depth may be used. In addition, the magnetically receptive layer 14, or a portion thereof, may be visible through the media layer 12. The portion of the magnetically receptive layer 14 visible through the media layer 12 may display a mark or message after being exposed to a magnetic field.

Magnetic ink printing methods with inks containing magnetic particles are known. For example, U.S. Pat. No. 3,998,160 (incorporated herein in its entirety by reference) relates to various magnetic inks used in printing digits, characters, or designs on checks or bank notes. The magnetic ink used for these processes generally consists of acicular magnetic particles, such as magnetite in a fluid medium, and a magnetic coating of ferric oxide, chromium dioxide, or similar materials dispersed in a vehicle containing binders and plasticizers.

Single component toner compositions generally contain, for example, magnetic particles, such as magnetite, resin binders, and other additives. There are several types of magnetites ranging from soft to hard. Generally, there are three types of iron oxides used: (1) cubic; (2) octahedral; and (3) acicular. U.S. Pat. No. 4,859,550 (incorporated in its entirety by reference herein) indicates that hard and/or soft magnetites may be incorporated into toner at amounts of from 35-70% by weight.

In applications requiring magnetic ink character recognition (MICR) capabilities, toners must generally contain magnetites having specific properties, the most important of which is a high enough level of remanence or retentivity. Retentivity is a measure of the magnetism left when the magnetite is removed from the magnetic field, i.e., the residual magnetism. In applications requiring MICR capability, it is important for the toner to show a high enough retentivity such that when the characters are read, the magnetites produce a signal. This is the signal strength of the toner composition. The signal level can vary in proportion to the amount of toner deposited on the document being generated. It will be understood that the magnetically receptive layer 14 may be composed using MICR ink or toner.

In addition, toner compositions used in single component development applications, i.e., those having 40-50% soft magnetites, typically have a low retentivity and a low signal strength. Soft or cubic magnetites give a low retentivity whereas octahedral and acicular magnetites give a higher retentivity. Therefore, past toner compositions have contained high levels of acicular magnetites to provide the desired retentivity. However, the use of toner compositions with all acicular magnetites is expensive, and often exhibit signal strengths that are too high. Thus, it will be understood that the magnetically receptive layer 14 may be composed of any suitable shaped magnetite shape and composition.

Still referring to FIG. 1 and FIG. 3 spaces 38 between magnetically receptive deposits 32 may be arranged to augment, or not otherwise impede, a counter magnetic force generated by an eddy current within the electric field signal distortion layer 16.

Referring now to FIG. 6 there is shown a side perspective view of an alternate embodiment of the portable RFID signal distortion device shown in FIG. 1. RFID signal distortion device 60 includes print substrate 62, adhesive layer 68, and electric field interference substrate 66. It will be understood that print substrate 62 and electric field interference substrate 66 are bonded together by adhesive layer 68 but are shown here as separate for illustration clarity and discussion.

Still referring to FIG. 6, print substrate 62 includes a printable or media surface 61 for printing artwork, general messages, instructions, or advertisement. Print substrate 62 also includes a magnetically receptive surface 63 for disrupting or interfering with data transmitted via RFID data transfer techniques such as magnetic induction or electric field backscatter techniques.

FIG. 6 also illustrates the adhesive layer 68. The adhesive layer 68 may be any suitable adhesive suitable for bonding print substrate 62 and electric field interference substrate 66. For example, adhesive layer 68 may be a pressure sensitive adhesive applied initially to either the print substrate 62 or electric field interference substrate 66 to facilitate manufacture of the portable RFID signal distortion device 60. In addition, adhesive layer 68 may include magnetically receptive particles for disrupting or interfering with data transmitted via RFID data transfer techniques such as magnetic induction or electric field backscatter techniques.

Still referring to FIG. 6 there is also shown a side view of electric field interference (EFI) substrate 66. EFI substrate 66 includes EFI top surface 65 and EFI bottom surface 64. EFI bottom surface 64 may also include a print receptive primer or color. EFI substrate 66 may be any suitable material or textile designed to interfere with data transmitted via RFID data transfer techniques such as magnetic induction or electric field backscatter techniques. In addition EFI substrate 66 may also be embossable with logos or messages showing EFI substrate 66 bottom surface 64.

Figure 7:
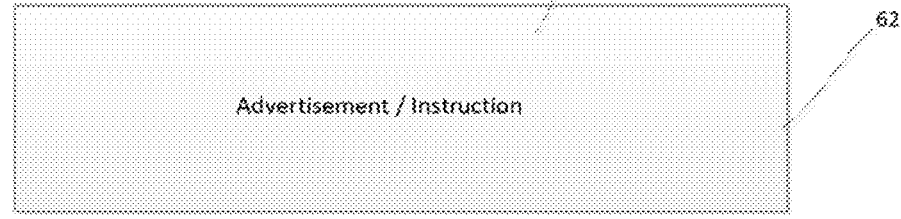
FIG. 7 is a pictorial top view of the print layer shown in FIG. 6.

Referring also to FIG. 7, there is shown a pictorial top view of the print substrate 62 shown in FIG. 6. Print substrate 62 includes printable media surface 61 for printing artwork, general messages, instructions, or advertisement.

Figure 8:
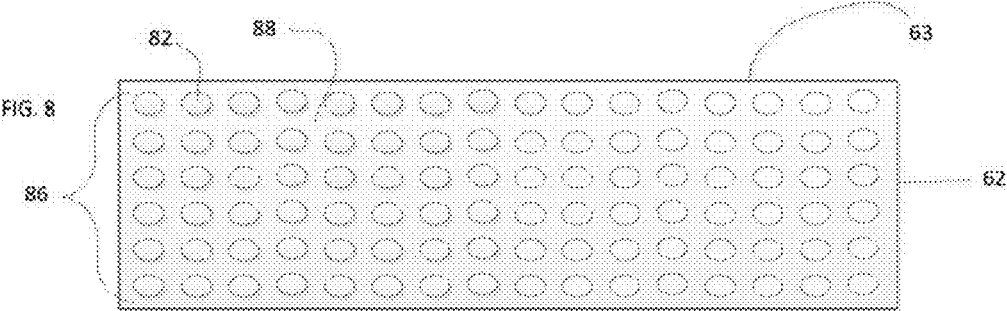
FIG. 8 is a pictorial bottom view of the print substrate shown in FIG. 6 showing magnetically receptive deposits.

Referring also to FIG. 8 there is shown is a pictorial bottom view of the print substrate 62 shown in FIG. 6 showing magnetically receptive deposits 82 arranged with spaces 88 to form magnetically receptive signal distortion grating 86. Magnetically receptive signal distortion grating 86 also comprises spaces 88 between magnetically receptive deposits 82. Spaces 88 may be any suitable size or shape arranged between magnetically receptive deposits 82 to interfere with data transmission for impinging magnetic and electric fields generated by an RFID reader or by an RFID card activated by an RFID Reader. The magnetically receptive deposits 82 may be any suitable magnetically receptive deposit shape or character painted, printed, or otherwise deposited on print substrate 62.

Figure 9:
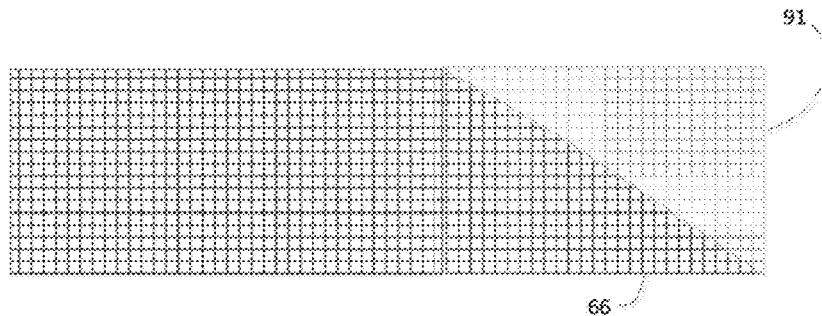
FIG. 9 is a pictorial bottom view of the radio signal substrate shown in FIG. 6 showing partial adhesive layer.

Referring also to FIG. 9 there is shown a pictorial bottom view of the EFI substrate 66 shown in FIG. 6 showing partial adhesive layer 91. It will be understood that adhesive layer 91 covers the entire bottom area of the EFI substrate 66 and is partially shown here for illustration and description clarity. EFI substrate 66 may be any suitable material or textile designed to interfere with data transmitted via RFID data transfer techniques such as magnetic induction or electric field backscatter techniques. Further, EFI substrate 66 may be any suitable material or textile designed to operate in conjunction with signal distortion grating 86 to interfere with data transmission for impinging magnetic and electric fields generated by an RFID reader or by an RFID card activated by an RFID Reader when RFID signal distortion device 60 substrates are assembled.

Figure 10:
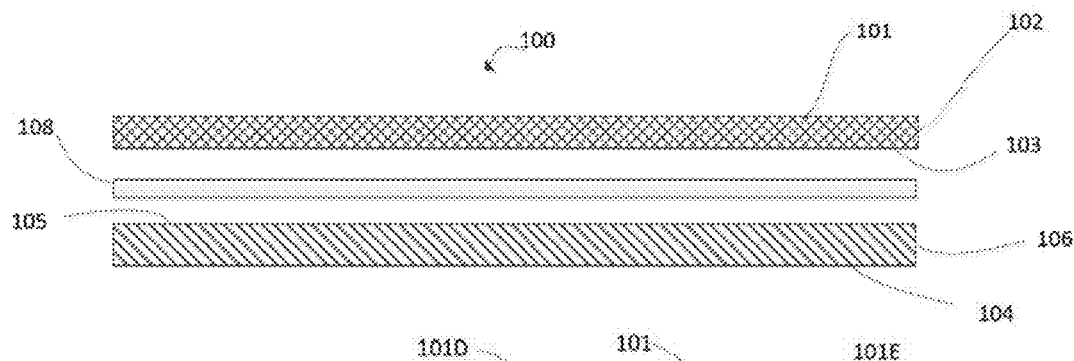
FIG. 10 is a side perspective view of an alternate embodiment of the portable RFID signal distortion device shown in FIG. 1.

Referring also to FIG. 10 there is shown a side perspective view of an alternate embodiment of the portable RFID signal distortion device shown in FIG. 1. RFID signal distortion device 100 includes print substrate 102, adhesive layer 108, and electric field interference substrate 106. It will be understood that print substrate 102 and electric field interference substrate 106 are bonded together by an adhesive layer 108 between substrate 102, bottom surface 103, and electric field interference substrate 106 top surface 105; but, the substrates are shown here as separate for illustration clarity and discussion. In addition, electric field interference substrate 106 also includes embossable surface 104 for embossing messages and, or, logos.

Figure 11:
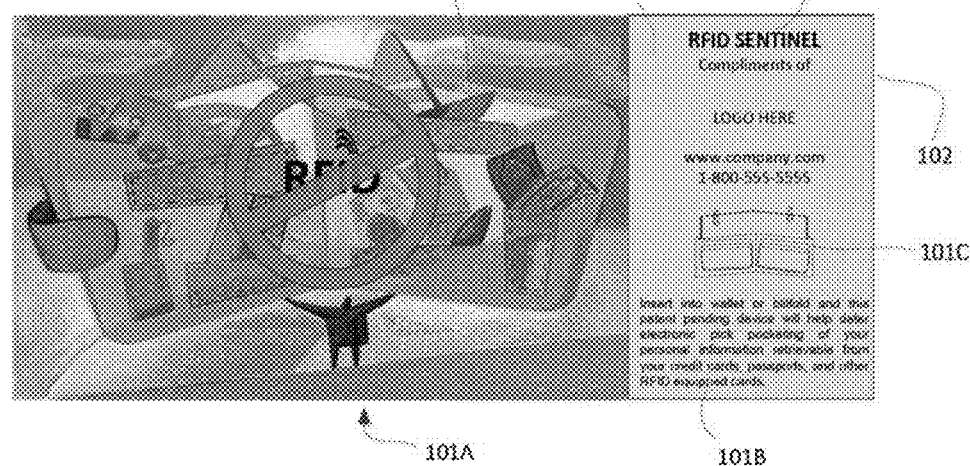
FIG. 11 is a pictorial top view of the print layer shown in FIG. 10.

Still referring to FIG. 10 and FIG. 11, print substrate 102 includes a printable or media surface 101 for printing artwork 101D, general messages 101B, instructions 101C, or advertisement 101E. Printed artwork 101D, messages 101B, instructions 101C, and advertisement 101E as shown in FIG. 11 is optionally printed with magnetic ink to form a magnetically receptive surface 101A for disrupting or interfering with data transmitted via RFID data transfer techniques such as magnetic induction or electric field backscatter techniques. The magnetically receptive surface 101A is preferably less than 25 microns.

Figure 12:
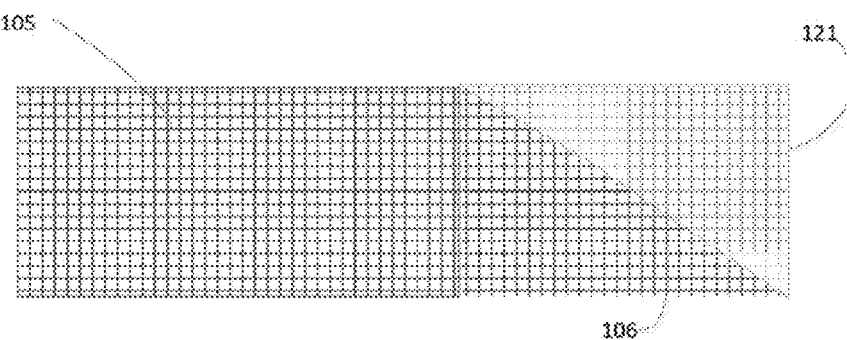
FIG. 12 is a pictorial bottom view of the radio signal substrate shown in FIG. 10 showing partial adhesive layer.

Referring also to FIG. 12 there is shown a pictorial bottom view of the EFI substrate 106 shown in FIG. 10 showing partial adhesive layer 121. It will be understood that adhesive layer 121 covers the entire bottom area of the EFI substrate 106 and is partially shown here for illustration and description clarity. EFI substrate 106 may be any suitable material or textile designed to interfere with data transmitted via RFID data transfer techniques such as magnetic induction or electric field backscatter techniques. Further, EFI substrate 106 may be any suitable material or textile designed to operate in conjunction with magnetically receptive surface 101A to interfere with data transmission for impinging magnetic and electric fields generated by an RFID reader or by an RFID card activated by an RFID Reader when RFID signal distortion device 100 substrates are assembled.

Referring also FIG. 5 there is shown a pictorial view of a billfold 54 employing the invention shown in FIG. 1, FIG. 6 and FIG. 10 adapted to the retrofitting of existing wallets, purses, credit card holders, and the like to provide protection by interfering with, or scrambling, data retrieval from RFID devices embedded in credit cards 52, personal identification cards, and other cards contained and transported therein. The RFID signal distortion device 60 or portable RFID signal distortion device 10 is constructed to allow scalability to dimensions conforming to dimensions of user preferred conventional wallets, purses, credit card holders, and the like.

It will be understood that the present invention overcomes the prior art problems by disrupting, or scrambling, data transfer. Thus, the invention advantageously accomplishes the objectives of the prior art solutions, i.e., the prevention of electronic pick pocketing; but, without complex micro-circuitry or the cumbersome solutions to shield, or prevent the interrogation signal from reaching the RFID enabled device.

It should be understood that the foregoing description is only illustrative of the invention. Accordingly, the present invention is intended to embrace all such alternatives, modifications and variances which fall within the scope of the appended claims.

What is claimed is:

1. A passive RFID data signal distortion device comprising:
   a first substrate comprising:
      a top surface area, wherein the top surface area is adaptable to receive print media, wherein the print media comprises a plurality of printed magnetically receptive deposits;
      a bottom surface area;
   a second substrate comprising an electric field disruptor; and
   an adhesion layer for bonding the bottom surface area to the second substrate.

2. The passive RFID data signal distortion device as in claim 1 wherein each of the plurality of printed magnetically receptive deposits comprises a layer thickness less than 20 microns.

3. The passive RFID data signal distortion device as in claim 1, wherein the spatial location of each of the plurality of printed magnetically receptive deposits is predetermined.

4. The passive RFID data signal distortion device as in claim 3 wherein the spatial location of each of the plurality of printed magnetically receptive deposits is predetermined according to an opposing magnetic field generated by the second substrate in response to an exterior magnetic field.

5. The passive RFID data signal distortion device as in claim 3 wherein the spatial location of each of the plurality of printed magnetically receptive deposits is predetermined according to a predetermined image.

6. The passive RFID data signal distortion device as in claim 1 wherein the second substrate comprises an aluminum electric field disruptor.

7. The passive RFID data signal distortion device as in claim 1 wherein the second substrate comprises a copper electric field disruptor.

8. The passive RFID data signal distortion device as in claim 1 wherein each of the plurality of printed magnetically receptive deposits comprise:
   magnetites;
   resin binders; and
   plastizers combined to form a laser printing toner composition.

* * * * *